United States Patent
Kuo

(10) Patent No.: US 7,477,066 B2
(45) Date of Patent: Jan. 13, 2009

(54) UNIVERSAL GRID COMPOSITE CIRCUIT BOARD TESTING TOOL

(75) Inventor: Po-Wen Kuo, Taipei County (TW)

(73) Assignee: Unitech Printed Circuit Board Corp., Tucheng, Taipei County (TW)

(*) Notice: Subject to any disclaimer, the term of this patent is extended or adjusted under 35 U.S.C. 154(b) by 0 days.

(21) Appl. No.: 11/649,303

(22) Filed: Jan. 4, 2007

(65) Prior Publication Data

US 2008/0164891 A1    Jul. 10, 2008

(51) Int. Cl.
    *G01R 1/073* (2006.01)
(52) U.S. Cl. .................................. 324/761; 324/754
(58) Field of Classification Search .............. 324/754, 324/761, 73.1
    See application file for complete search history.

(56) References Cited

U.S. PATENT DOCUMENTS 2,014,379 A * 9/1935 Hockner ..................... 324/407
4,968,931 A * 11/1990 Littlebury et al. ........... 324/760
5,450,017 A * 9/1995 Swart ......................... 324/754
5,767,692 A * 6/1998 Antonello et al. ........... 324/761

\* cited by examiner

*Primary Examiner*—Ernest F Karlsen
(74) *Attorney, Agent, or Firm*—Bacon & Thomas, PLLC

(57) ABSTRACT

The present invention discloses a universal grid composite circuit board testing tool having a probe station, a clamp base and a conducting wire base. The probe station and clamp base separately have a plurality of conducting probes and long needles. Both ends of the long needle are electrically contacted with the testing point and conducting probe of the testing printed circuit board. The conducting wire base includes a conducting wire contact point electrically connected to a plurality of conducting probes in the probe station at the same time, such that when a testing printed circuit board is tested, it is not necessary to prepare a new probe station and a new conducting wire base. The test simply requires users to change the installation positions of the long needles and run a comparison program according to the positions of the testing points of the testing printed circuit board.

3 Claims, 4 Drawing Sheets

UNIVERSAL GRID COMPOSITE CIRCUIT BOARD TESTING TOOL

BACKGROUND OF THE INVENTION

1. Field of the Invention

The present invention relates to a universal grid composite circuit board testing tool, and more particularly to a circuit board testing tool including a plurality of fixed intervals disposed in a probe station and a clamp base and corresponding to a bore and a through hole respectively, a conducting probe and a long needle respectively and electrically connected to the bore and the through hole, such that if a testing printed circuit board of a different specification is tested, it is necessary to change the installation positions of the clamp base and the long needle and run a comparison program. A conducting wire contact point can be connected to the conducting probes in a one-to-two or one-to-many mode to increase the testing point area, save the tool production time, and lower the cost of the tool.

2. Description of the Related Art

As it is necessary to test whether or not the circuit of a printed circuit board is good by running a testing program after the printed circuit board is made according to a prior art, printed circuit board manufacturers may use different testing machines including two main kinds of testing tools: a dedicated testing tool and a universal grid testing tool to test the printed circuit boards. The testing machine including a dedicated testing tool is cheaper and quicker, but such machine uses finer and more expensive needle heads to cope with the one-on-one flexible conducting probe used by a precision circuit contact point of the printed circuit board. The needle heads are damaged easily and must be replaced frequently, and thus an increase of testing cost is resulted. On the other hand, the testing machine including a universal grid testing tool is expensive, but its probe is a general long needle that can be used repeatedly and thus usually comes with a low price. When the universal grid testing tool is used for testing a sample of the printed circuit board in general conditions, the universal grid testing tool can be used first, and then switched to the dedicated testing tool after the printed circuit board is approved to enter its mass production. Therefore, it is necessary to use the probe station and the long needle of the manufacturing tool more often, and the number of man-hours for drilling bores and the number of probing needles will be increased accordingly, and the conventional testing tool is definitely not cost-effective.

To overcome the foregoing shortcomings, some manufacturers leverage the advantages of the dedicated testing machine comprised of a testing system and a universal grid testing machine of a lower price and the repeated use of the long needles to produce a composite testing tool, but the application of such testing machine still has the following drawbacks:

1. It takes too much time for users to set up the tool. Generally, it takes more than half an hour to set up one tool and connect related flat cables. If the number of points of the tools is over 12,000 and the number of flat cables is approximately equal to 185, then it will take lots of time for the installation.
2. Manufacturers usually do not carry enough stock of the tools. If a manufacturer has an average of 15 to 20 mass productions per month, and each mass production requires at least two sets of tools, then the inventory of tools will run out very soon.
3. The cost of the tool is high. After a tool is scrapped, the long needle can be recycled and reused, but the needle base of the probe station cannot be recycled or reused, and thus the cost will be high.
4. The tool may be damaged easily, since the tool is installed repeatedly and transported frequently, and testing personnel may damage the tool accidentally.
5. The manufacturing time of the tool is too long. Since the tool includes a probe station and a long needle, it usually takes more than four days to complete coding a program, drilling bores and creating probing needles for only one tool. If there are many testing points, the number of working days will be even longer. Particularly, the manufacturing time of the probe station is the longest among all these components.

Since the conducting wire contact point of the aforementioned testing tool is connected to only one conducting probe at a time (such as the test for a traditional computer motherboard having a larger printed circuit board and a lager distance between testing contact points), therefore there is no much difference on the testing efficiency, and such testing tool can meet user requirements. As the circuit boards of mobile phones and mobile electronic devices become increasingly smaller, the area of the printed circuit board and the distance between testing contact point become smaller. Although the testing area of a probe station can accommodate and test several printed circuit boards of the same specification at a time, such arrangement increases the cost of the testing system and is definitely not an ideal application.

SUMMARY OF THE INVENTION

In view of the shortcomings of the conventional apparatus and structure, the inventor of the present invention based on years of experience in the related industry to conduct extensive researches and experiments, and finally developed a universal grid composite circuit board testing tool in accordance with the present invention.

Therefore, it is a primary objective of the present invention to provide a universal grid composite circuit board testing tool that comprises a probe station, a clamp base and a conducting wire base. The probe station includes a plurality of bores with a plurality of fixed intervals thereon, and each bore has a conducting probe. The clamp base is disposed on the probe station and keeps a specific distance from the probe station, and the clamp base further includes a plurality of through holes disposed thereon and keep a constant distance from the corresponding bores, and each through hole contains a long needle, and an end of the long needle is contacted with a testing point of the testing printed circuit board, and another end of the long needle is tilted outward and electrically contacted with a conducting probe of the probe station. The conducting wire base includes a plurality of conducting wire contact points electrically connected to the testing point of the testing printed circuit board through a flat electric cable and the conducting probe, such that when a testing printed circuit board of a different specification is tested, it is not necessary to change the probe station and conducting wire base, but the test simply requires users to change the installation positions of the clamp base and the long needle and the positions of the testing points and run a comparison program according to the different specification of the testing printed circuit board. As a result, the present invention can save the manufacturing time of the tool and lower the cost of the tool.

Another objective of the present invention is to provide a universal grid composite circuit board testing tool that connects each conducting wire contact point with more than two conducting probes at the same time, so that the testing printed circuit boards of different specifications can be tested without increasing the number of conducting wire bases, so as to save the manpower, time and cost for the testing.

A further objective of the present invention is to test the testing printed circuit boards of different areas simply by a probe station and a clamp base with a sufficient number of holes corresponding to the bores.

To make it easier for our examiner to understand the present invention, the following embodiment accompanied with the related drawings are described in details.

DETAILED DESCRIPTION OF THE PREFERRED EMBODIMENTS

Figure 1:
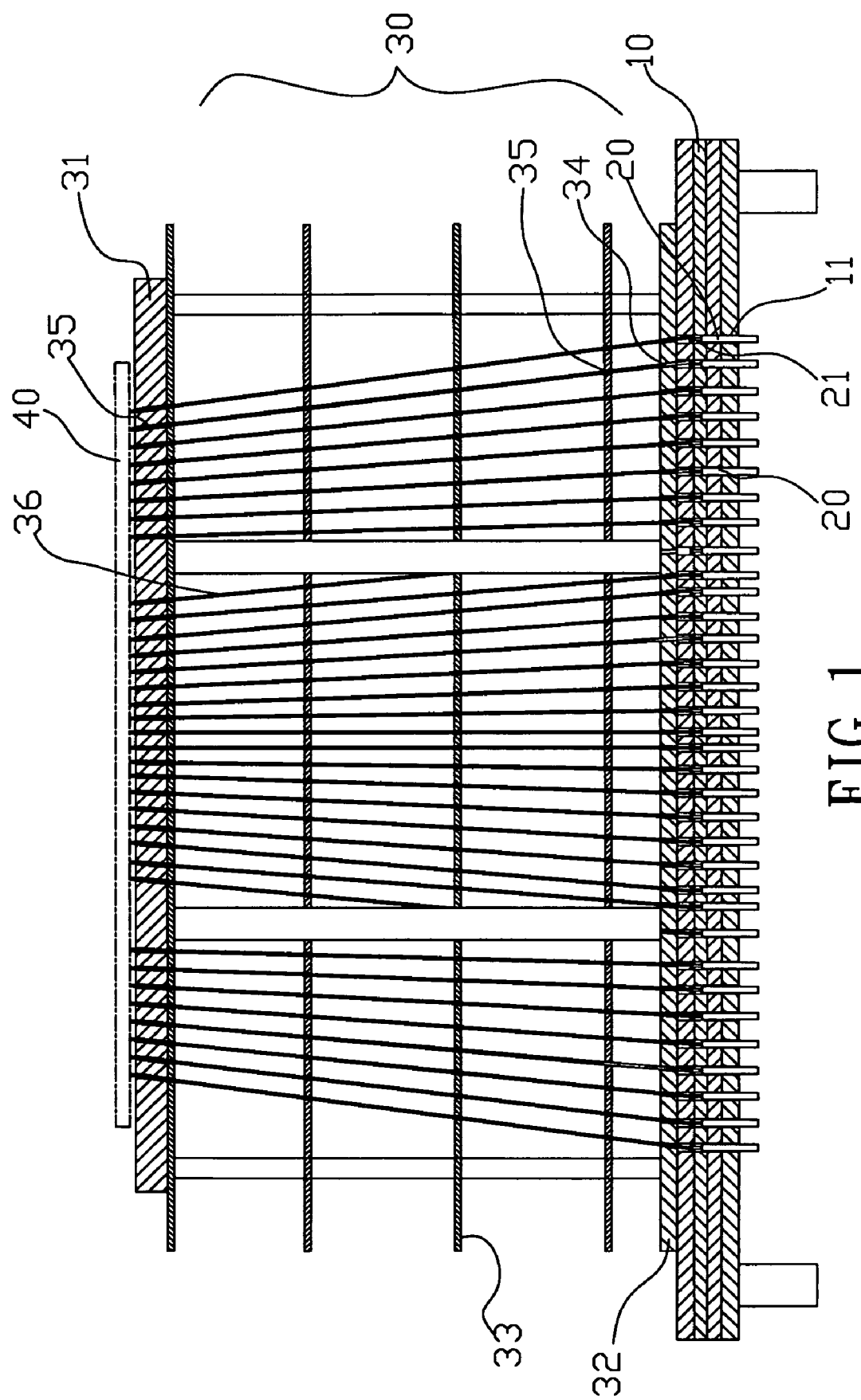
FIG. 1 is a cross-sectional view of the present invention.
Figure 2:
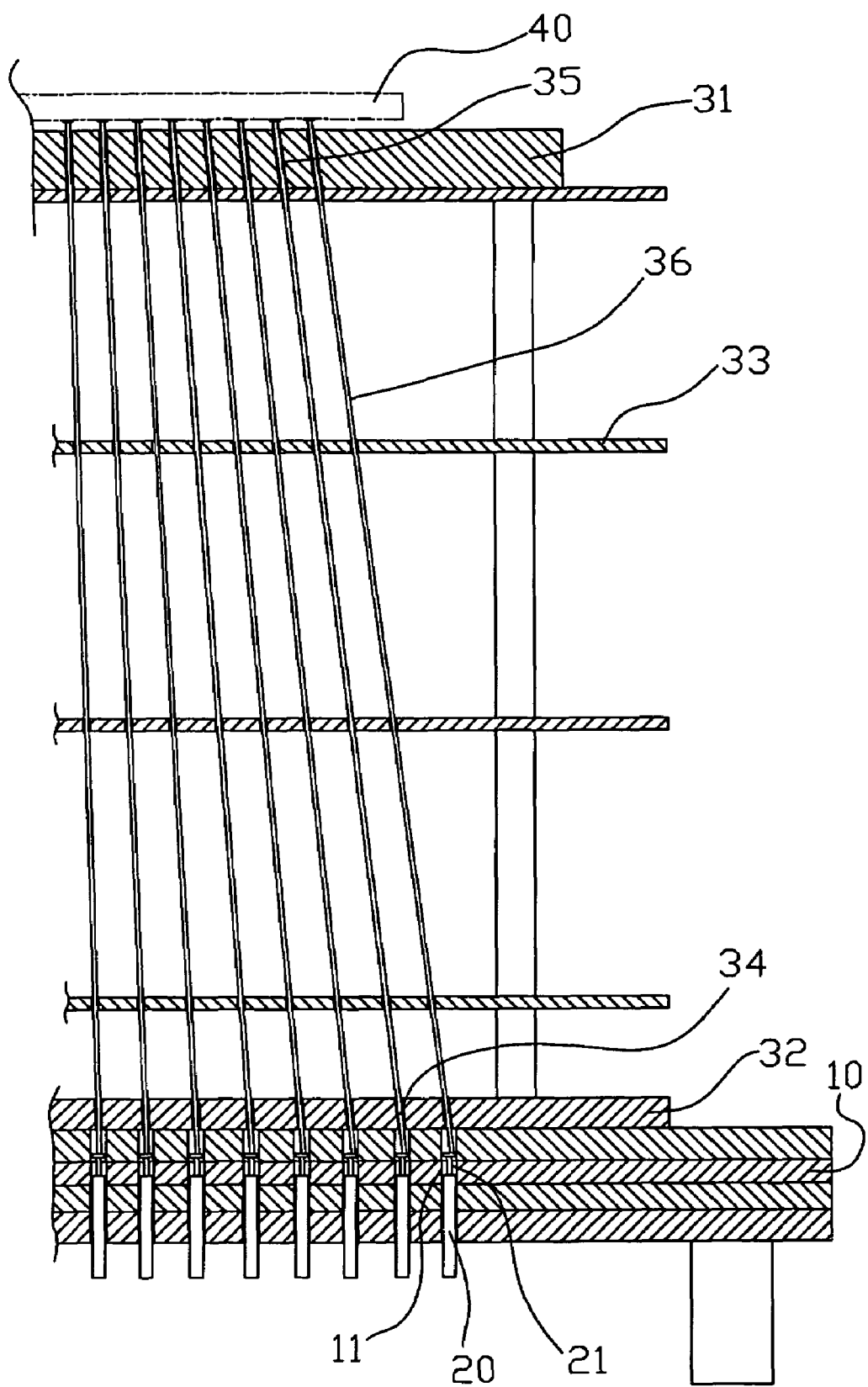
FIG. 2 is an enlarged sectional view of a portion of the present invention.
Figure 3:
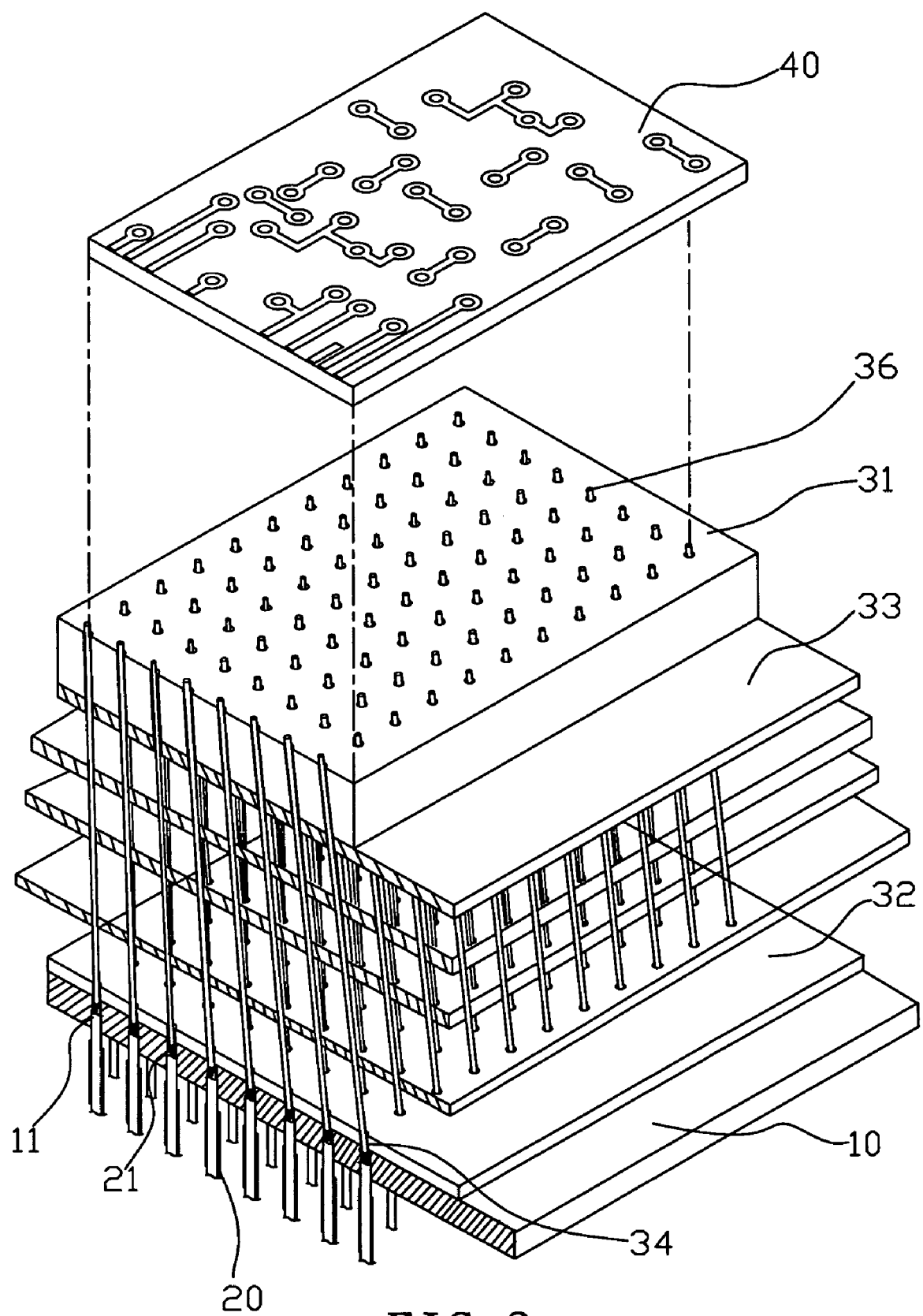
FIG. 3 is a schematic view of a portion of a probe station of the present invention.

Referring to FIGS. 1 and 2 for a universal grid composite circuit board testing tool of the invention, the testing tool comprises a probe station 10 mounted onto a testing machine (not shown in the figure). In FIG. 3, the probe station 10 includes a plurality of bores 11 disposed on a specific area and these bores 11 keep a predetermined distance with each other, and a conducting probe 20 is contained in each bore 11, and an end of the conducting probe 20 is in contact with a resilient element 21 (which is a spring in this embodiment) in the bore 11, and another end of the conducting probe 20 is protruded out from the bore 11.

Further, the probe station 10 has a clamp base 30, and the area of the clamp base 30 can be changed according to the manufacturer's requirement. The clamp base 30 is comprised of corresponding upper and lower bases 31, 32 and one or more clamping plates 33 (there are 4 clamping plates in this embodiment) is/are disposed between the upper and lower bases 31, 32, and the clamping plates 33 keep a specific distance apart from each other. The upper and lower bases 31, 32 include a plurality of through hole 34 corresponding to the bores 11, and the upper and lower bases 31, 32 and the clamping plate 33 include a plurality of needle holes 35 corresponding to the through holes 34 and tilted outward obliquely. The long needles 36 corresponding to the testing points of the testing printed circuit board 40 are passed through the through holes 34 and the needle holes 35, and the number of long needles 36 is equal to the number of the conducting probes 20 and the long needles 35 are electrically contacted with the corresponding conducting probes 20 one by one.

Figures 4, 4A:
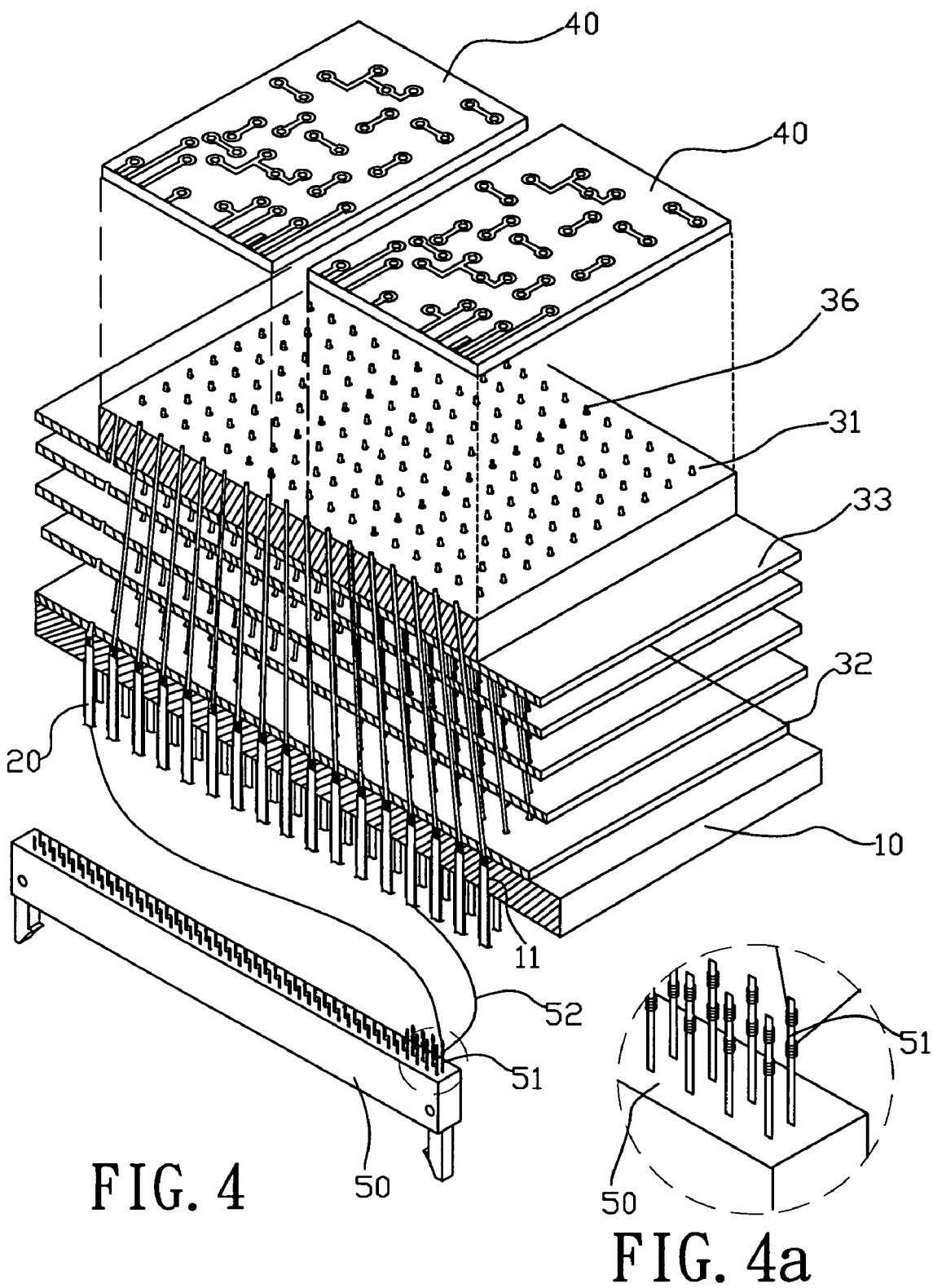
FIG. 4 is a schematic view of connecting a probe station and a conducting wire base in accordance with the present invention.
FIG. 4A is an enlarged view of connecting a probe station and a conducting wire base in accordance with the present invention.

Referring to FIGS. 4 and 4A, the probe station 10 includes one or more conducting wire bases 50 (also known as horn connector), and the conducting wire bases 50 include a plurality of conducting wire contact points 51, and the conducting wire contact points 51 can be connected separately to the conducting probes 20 through the flat electric cables 52, such that if a printed circuit board of a different specification is tested, it is not necessary to prepare a new probe station 10 according to a different specification of the testing printed circuit board 40, but the test simply requires changing the installation positions of the clamp base 30 and the long needle 36 and setting whether or not to electrically connect the circuit between the conducting wire contact point 51 with the testing point of the testing printed circuit board 40 through a testing program, so as to save the manufacturing time of the tool and effectively lower the cost of the tool.

The conducting wire contact points 51 are connected simultaneously to two or more two conducting probes 20 through the flat electric cables 52, and thus the number of probing needles of the probe station can be increased by one time or two times over the prior art, provided that the number of conducting wire bases 50 is equal to the number of conducting wire contact points. Therefore, the number of testing points of the testing printed circuit board 40 is increased by the same percentage, so as to save ½ to ⅓ of the manufacturing time and improve the testing efficiency for the same tests.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A universal grid composite circuit board testing tool, comprising:
    a probe station having a clamp base of variable installation positions, and
        a plurality of corresponding bores and through holes drilled on said probe station and said clamp base respectively, and
        a predetermined distance is formed between said bores and between said through holes;
        a plurality of conducting probes installed in said bores, and a first end of said each conducting probe being connected to a resilient element in said bore and a second end of said each conducting probe protruding from said bore;
        a plurality of long needles of variable installation positions inserted into said clamp base and electrically connected one-to-one with said conducting probes;
        one or more conducting wire bases connected with said conducting probe, and said each conducting wire base having a conducting wire contact point, and said each conducting wire contact point being connected separately via a plurality of electric cables to two through holes and conducting probes;
    when a printed circuit board of a different specification is tested, a new probe station and new conducting wire base are not necessary.

2. A universal grid composite circuit board testing tool, comprising:
    a probe station having a clamp base of variable installation positions, and
        a plurality of corresponding bores and through holes drilled on said probe station and said clamp base respectively, and
        a predetermined distance is formed between said bores and between said through holes;
        a plurality of conducting probes installed in said bores, and a first end of said each conducting probe being connected to a resilient element in said bore and a second end of said each conducting probe protruding from said bore;

a plurality of long needles of variable installation positions inserted into said clamp base and electrically connected one-to-one with said conducting probes;

one or more conducting wire bases connected with said conducting probe, and said each conducting wire base having a conducting wire contact point, and said each conducting wire contact point being connected via a plurality of electric cables to two or more conducting probes;

whereby when a printed circuit board of a different specification is tested, a new probe station and new conducting wire base are not necessary.

3. A universal grid composite circuit board testing tool, comprising:

a probe station having a clamp base of variable installation positions, and a plurality of corresponding bores and through holes drilled on said probe station and said clamp base respectively, and a predetermined distance is formed between said bores and between said through holes;

a plurality of conducting probes installed in said bores, and a first end of said each conducting probe being connected to a resilient element in said bore and a second end of said each conducting probe protruding from said bore;

a plurality of long needles of variable installation positions inserted into said clamp base and electrically connected one-to-one with said conducting probes;

one or more conducting wire bases connected with said conducting probe, and said each conducting wire base having a conducting wire contact point, and said each conducting wire contact point being connected simultaneously via a plurality of electric cables to two or more conducting probes;

whereby when a printed circuit board of a different specification is tested, a new probe station and new conducting wire base are not necessary.

* * * * *